(12) United States Patent
Chen et al.

(10) Patent No.: US 8,754,508 B2
(45) Date of Patent: Jun. 17, 2014

(54) STRUCTURE TO INCREASE RESISTANCE TO ELECTROMIGRATION

(75) Inventors: Hsien-Wei Chen, Hsin-Chu (TW); Hung-Jui Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 105 days.

(21) Appl. No.: 13/598,196

(22) Filed: Aug. 29, 2012

(65) Prior Publication Data

US 2014/0061923 A1   Mar. 6, 2014

(51) Int. Cl.
*H01L 29/06* (2006.01)

(52) U.S. Cl.
USPC .................. 257/622; 257/E23.131; 257/758; 257/774; 438/118; 438/622

(58) Field of Classification Search
CPC .................. H01L 29/0657; H01L 2924/01079
USPC .......... 257/E23.131, 619, 622, 758, 774, 781, 257/786; 438/118, 459, 612, 622, 666, 977
See application file for complete search history.

(56) References Cited

U.S. PATENT DOCUMENTS

| | | | |
|---|---|---|---|
| 6,054,340 A * | 4/2000 | Mitchell et al. ............... | 438/132 |
| 6,177,297 B1 * | 1/2001 | Chen et al. ..................... | 438/132 |
| 6,372,554 B1 * | 4/2002 | Kawakita et al. ............. | 438/132 |
| 6,440,833 B1 * | 8/2002 | Lee et al. ....................... | 438/601 |
| 6,476,491 B2 * | 11/2002 | Harada et al. ................. | 257/758 |
| 6,949,416 B2 * | 9/2005 | Miyamoto et al. ............ | 438/132 |
| 6,989,577 B2 * | 1/2006 | Koike ............................ | 257/529 |
| 7,939,913 B2 * | 5/2011 | Watanabe et al. ............. | 257/620 |
| 2001/0045651 A1 * | 11/2001 | Saito et al. ..................... | 257/750 |
| 2003/0214040 A1 * | 11/2003 | Yamashita et al. ............ | 257/758 |
| 2004/0021227 A1 * | 2/2004 | Watanabe ...................... | 257/773 |

* cited by examiner

*Primary Examiner* — Chris Chu
(74) *Attorney, Agent, or Firm* — Slater & Matsil, L.L.P.

(57) ABSTRACT

A semiconductor device includes a recess in a polymer layer between two adjacent metal lines and over passivation layer or anti-electromigration layers on redistribution metal lines to increase the resistance to electromigration.

21 Claims, 14 Drawing Sheets

STRUCTURE TO INCREASE RESISTANCE TO ELECTROMIGRATION

BACKGROUND

As the minimum feature sizes of semiconductor devices decrease and the spacing of the adjacent metal lines decreases, reliability problems such as failing Highly Accelerated Temperature/Humidity Stress Test (HAST), increasing electromigration and stress migration become more serious. Shrinking of device dimensions and scaling down of metal spacing and width cause higher resistance and current density. Higher current density can increase the rate at which metals grow metallic dendrites that reduce the spacing between the adjacent metal lines and eventually create a short.

One way to prevent interconnect failure from such shorts from occurring is to increase metal spacing. Increasing metal spacing is impractical because devices will continue to shrink. As an alternative, metal bridge shorts can be reduced by applying various surface treatments to the metal, e.g., exposing the metal layer to ammonia ($NH_3$) has been found to reduce metal diffusion along that interface. Introducing dopants into the metal layer also limits diffusion. Unfortunately, these techniques for reducing the rate at which metal diffuses raise the resistance of the metal layer significantly.

Accordingly, there is a need for a novel structure or an improved process for making a semiconductor device that includes metal interconnects. There is a need for such a novel structure or a process that reduce the metal bridge. The present invention provides such a novel structure and a process.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3-1 to 3-5 are cross-sectional views of portions of a semiconductor die in accordance with various embodiments of the present disclosure;

FIGS. 4-1 to 4-5 are cross-sectional views of portions of a semiconductor die in accordance with various embodiments of the present disclosure;

FIGS. 5-1 to 5-5 are cross-sectional views of portions of a semiconductor die in accordance with various embodiments of the present disclosure.

Corresponding numerals and symbols in the different figures generally refer to corresponding parts unless otherwise indicated. The figures are drawn to illustrate the relevant aspects of various embodiments and are not drawn to scale.

DETAILED DESCRIPTION

Figure 1:
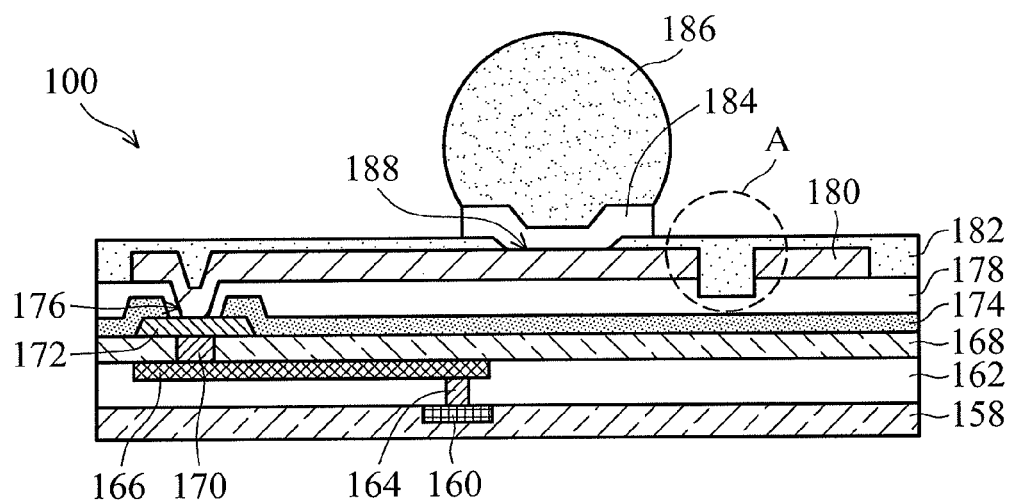
FIGS. 1 to 1-1 are cross-sectional views of semiconductor die structures in accordance with various embodiments of the present disclosure.
Figure 1:
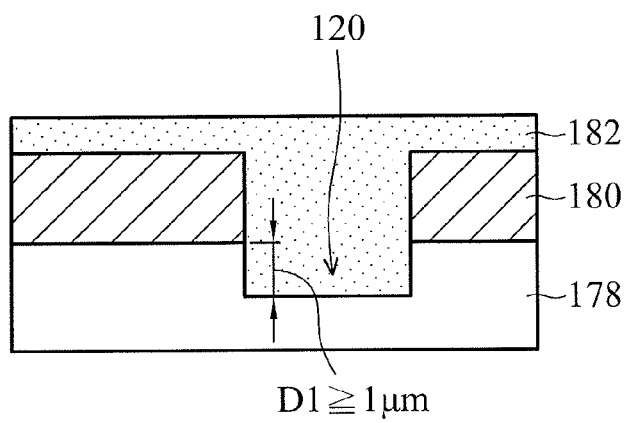

The making and using of some embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a package structure that uses one or more of solder balls, micro bumps, metal pillars (e.g., copper pillars), copper studs, gold studs or their combinations. The disclosure may also be applied, however, to a variety of packages of the semiconductor industry. It is understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over a second feature in the description that follows may include embodiments in which the first and second features are formed in direct contact, and may also include embodiments in which additional features may be formed interposing the first and second features, such that the first and second features may not be in direct contact.

Spatially relative terms, such as "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Stress migration or electromigration in a metal interconnection line can be characterized by the ion movement induced by a high electrical current density. As the feature size of semiconductor devices scales down, the current density consequently increases and electromigration-induced metallization failures increase. Semiconductor devices are characterized by a high electrical current density and metallic dendrites growth between two adjacent redistribution lines. Consequently, metallic dendrites increase metal bridges and electromigration failures. Various embodiments of the present disclosure can inhibit metal bridges and increase the resistance to electromigration. Particularly, a recess is formed in a polymer layer or an anti-electromigration layer is formed on redistribution lines.

FIG. 1 is a cross-sectional view of a semiconductor die structure in accordance with various embodiments of the present disclosure. Referring to FIG. 1, semiconductor die 100 comprises substrate 158. In some embodiments, semiconductor die 100 is rectangular or square. Substrate 158 may be a silicon substrate. In some embodiments, substrate 158 may be silicon-on-insulator, silicon carbide, III-V materials or sapphire. Substrate 158 may further comprise a variety of electrical circuits 160. Electrical circuits 160 formed on substrate 158 may be any type of circuitry suitable for a particular application. In certain embodiments, electrical circuits 160 may include various n-type metal-oxide semiconductor (NMOS) and/or p-type metal-oxide semiconductor (PMOS)

devices made using high-k dielectric materials including hafnium silicate, zirconium silicate, hafnium dioxide and zirconium dioxide. Electrical circuits 160 may also include other transistors, such as fin field effect transistor (FinFET) and other planar transistors, capacitors, resistors, diodes, photo-diodes, fuses and the like. Electrical circuits 160 may be interconnected to perform one or more functions. The functions include memory structures, processing structures, sensors, amplifiers, power distribution, input/output circuitry or the like.

Interlayer dielectric layer 162 is formed on electric circuits 160. Interlayer dielectric layer 162 may be formed of low-k dielectric materials, such as fluorine-doped silicon oxide with dielectric constant about 2.0~4.5. In other embodiments, low-k dielectric materials are formed of Hydrogen silsesquioxane (HSQ) or methylsilsesquioxane (MSQ) with a dielectric constant of about 3.0. In some embodiments, low-k dielectric materials are formed of carbon-doped silicon oxide with a dielectric constant of about 3.0. Still in other embodiments, low-k dielectric materials are formed of porous carbon-doped silicon oxide with a dielectric constant of about 2.5. Yet in some embodiments, low-k dielectric materials may be formed of dielectric materials or porous dielectric materials commercially available under the trademark SILK™ and having a dielectric constant lower than about 2.6. Still in some embodiments, low-k dielectric materials may also be formed of porous silicon oxide with a dielectric constant lower than about 2.0.

Referring to FIG. 1, a plug 164 is formed in interlayer dielectric 162 and is connected to electric circuits 160. The plug is formed of a metal, which may be titanium, titanium nitride, tungsten, aluminum, tantalum, copper or combinations thereof. Plug 164 is connected to bottom metal layer 166, which is formed of copper, aluminum, tantalum, titanium, titanium nitride, tungsten, or combinations thereof and disposed in interlayer dielectric layer 162. Another interlayer dielectric layer 168 is disposed over the metal layer 166 and is formed of low-k dielectric materials similar to those discussed with respect to interlayer dielectric layer 162. Top plug 170 is disposed in interlayer dielectric layer 168 and is electrically connected to bottom metal layer 166. Top plug 170 is formed of a metal, which may be tungsten, copper, titanium nitride, tantalum, aluminum or alloy thereof. Top plug 170 is connected to top metal layer 172, which is formed of aluminum, copper, titanium, titanium nitride, tungsten, or alloy thereof. While FIG. 1 shows bottom metal layer 166 and top metal layer 172, one skilled in the art will recognize that one or more interlayer dielectric layers (not shown), and the associated plug and metal layers (not shown) may be formed between bottom metal layer 166 and top metal layer 172.

A passivation layer 174 is deposited on top metal layer 172. In some embodiments, passivation layer 174 includes non-organic materials such as un-doped silicate glass, silicon nitride, silicon oxide, silicon oxynitride, boron-doped silicon oxide, phosphorus-doped silicon oxide and the like. Opening 176 is formed in passivation layer 174 to provide an external electrical connection. Opening 176 is formed by photolithography and etch. A first polymer layer 178 is deposited on passivation layer 174. First polymer layer 178 is made of polymer materials such as polyimide, polybenzoxazole (PBO), silicone, benzocyclobutene (BCB), epoxy, molding compound, such as epoxy resins, molded underfill, such as a resin, and the like. First polymer layer 178 may be made by any suitable method known in the art such as spin coating and an optional curing step. An opening corresponding to opening 176 is formed in the first polymer layer 178 by photolithography and etch. Redistribution metal line 180 is formed on first polymer layer 178 and fills the opening 176. Redistribution metal line 180 may be made of metals such as titanium, titanium nitride, aluminum, tantalum, copper and combinations thereof. Redistribution metal line 180 may be made by any suitable method known in the art such as sputter, CVD or electroplating. Redistribution metal line 180 provides a conductive path between top metal layer 172 and top surface of the semiconductor die 100. Depending on the method of deposition, the redistribution metal line 180 may be patterned by a photolithography and etch or may be selectively deposited.

A second polymer layer 182 is formed on redistribution metal line 180 and first polymer layer 178. Second polymer layer 182 is made of polymer materials such as polyimide, polybenzoxazole (PBO), silicone, benzocyclobutene (BCB), epoxy, molding compound, such as epoxy resins, molded underfill, such as a resin, and the like. Second polymer layer 182 may be made by any suitable method known in the art such as spin coating or lamination and an optional curing step. Second polymer layer 182 is patterned to form a plurality of openings that exposes a bottom conductive pad 188 portion of redistribution metal line 180. Top conductive pad 184 is formed in and partially over the second polymer layer 182 and connects to bottom conductive pad 188. An electro-less (E-less) plating forms top conductive pad 184. Top conductive pad 184 may have single-layer structure or composite structure including a plurality of sub-layers formed of different materials, and may comprise one or more materials selected from the group consisting of titanium, copper, nickel, palladium, gold, tantalum, and combinations thereof. In some embodiments, top conductive pad 184 is formed of electro-less nickel electro-less palladium immersion gold (ENEPIG), which includes nickel layer, palladium layer on the nickel layer, and gold layer on the palladium layer. Gold layer may be formed using immersion plating. In other embodiments, top conductive pad 184 may be formed of other materials and methods including, but not limited to, electro-less nickel immersion gold (ENIG), electro-less nickel electro-less palladium (ENEP), direct immersion gold (DIG), or the like.

Conductive material 186 is provided on top conductive pad 184. Conductive material 186 is made of a solder ball, solder, a micro bump, a copper pillar, a metal pillar, a copper stud, a gold stud or combinations thereof. In some embodiments, a solder ball can be formed by commonly used methods such as ball transfer or ball placement. In other embodiments, conductive material 186 is made of a micro bump such as copper, tin, nickel, titanium, tantalum, solder, combinations thereof, and micro bump can be formed by photolithography and electroplating or plating. Still in further embodiments, conductive material 186 is made of a metal pillar such as titanium, tin, solder, copper, tantalum, nickel, combinations thereof, and the metal pillar can be formed by photolithography and electroplating or other plating.

FIG. 1-1 is a detailed view of area A of FIG. 1. A recess 120 in first polymer layer 178 is formed between two adjacent redistribution metal lines 180. A recess 120 with a depth D1 of about or greater than 1 um between two adjacent redistribution metal lines can prevent formation of a metal bridge during the operation of semiconductor devices. An anti-electromigration layer may also be formed on redistribution metal lines 180 to increase the resistance to electromigration.

Figure 2:
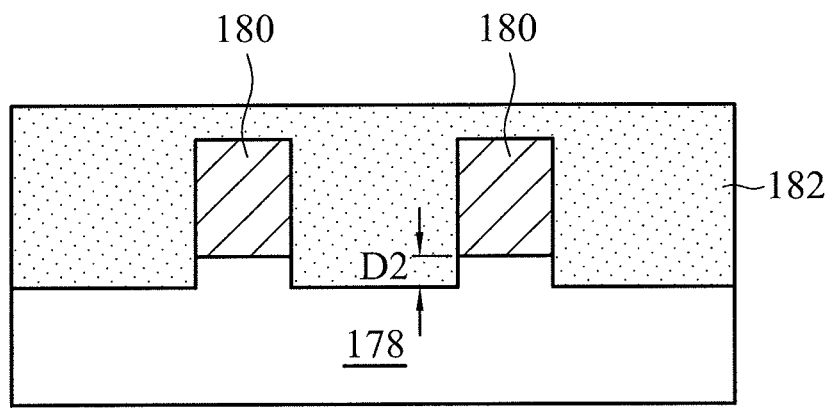
FIGS. 2 to 2-4 are cross-sectional views of portions of a semiconductor die in accordance with various embodiments of the present disclosure.
Figures 1, 2:
Figure 2:
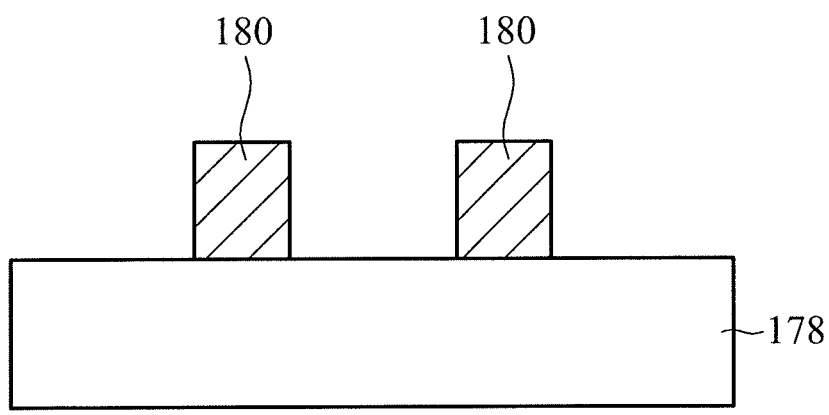

FIG. 2 shows a structure at a location of FIG. 1 that is the same as the location of as FIG. 1-1. Explanation of the same or similar processes to the description from substrate 158 to passivation layer 174 discussed in association with FIG. 1 will be omitted. Referring back to FIG. 2, a recess with a depth D2 of about or greater than 1 um is formed in a first polymer layer 178 between two adjacent redistribution metal lines 180. The various operations to form the partially fabricated structure of FIG. 2 is shown in more detail and described in association with FIGS. 2-1 to 2-4.

Referring to FIG. 2-1, a first polymer layer 178 is formed over passivation layer (layer 178 of FIG. 1, not shown). First polymer layer 178 is made of polymer materials such as polyimide, polybenzoxazole (PBO), silicone, benzocyclobutene (BCB), epoxy, molding compound, such as epoxy resins, molded underfill, such as resins, and the like. First polymer layer 178 may be made by any suitable method known in the art such as spin coating and an optional curing step with 200 to about 400 degree Celsius.

Referring to FIG. 2-2, redistribution metal lines 180 are formed on the first polymer layer 178 by a photolithography step, a metal deposition, and optionally etching. Redistribution metal line 180 may be a single material layer, or a multi-layered structure and may be made of metals such as titanium, titanium nitride, aluminum, tantalum, copper and combinations thereof. Redistribution metal line 180 may be made by any suitable method known in the art such as physical vapor deposition (PVD), sputter, chemical vapor deposition (CVD) or electroplating. The spacing between two adjacent redistribution metal lines 180 is less than about 20 um. In some embodiments, the spacing between two adjacent redistribution metal lines 180 is less than about 10 um. In some embodiments, a cleaning step is used to remove photoresist from the photolithography step.

Figures 2, 3:
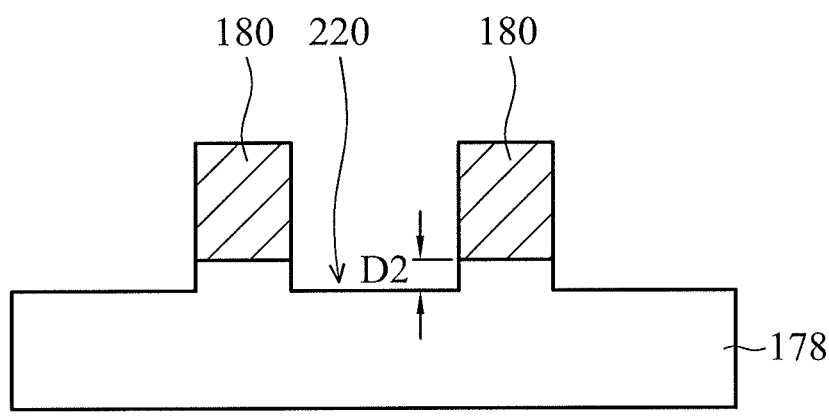

Referring to FIG. 2-3, a recess 220 is formed in first polymer layer 178 on the portions which are not covered by redistribution metal line 180. The depth D2 of recess 220 is about or greater than 1 um. The forming method of recess 220 may be a plasma etch with gas, such as nitrogen, oxygen, nitrous oxide, oxygen-based gas, oxygen-based gas mixture, helium, argon, and the like using the redistribution metal lines 180 as an etch mask. In some embodiments, the forming method of recess 220 may be an ion bombardment with gas, such as nitrogen, argon, nitrogen based gas, and the like. A cleaning step may follow to remove byproducts from the plasma etch.

Figures 2, 3, 4:
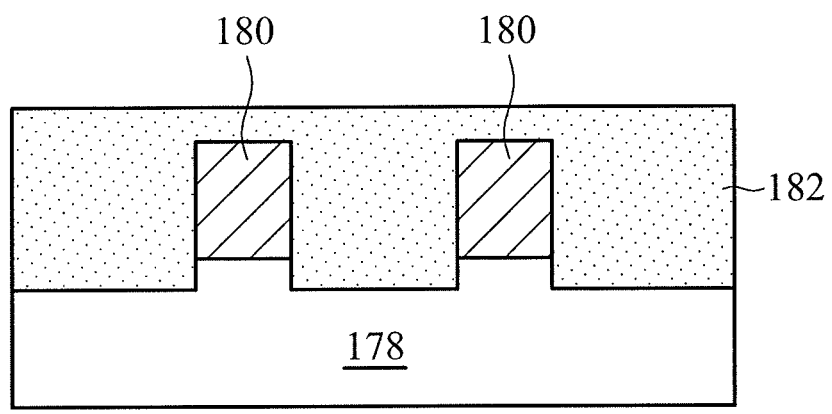

Referring to FIG. 2-4, a second polymer layer 182 is formed over and around redistribution metal line 180 and first polymer layer 178. Second polymer layer 182 is made of polymer materials such as polyimide, polybenzoxazole (PBO), silicone, benzocyclobutene (BCB), epoxy, molding compound, such as epoxy resins, molded underfill, such as a resin, and the like. Second polymer layer 182 may be made by any suitable method known in the art such as spin coating or lamination and an optional curing step with 200 to about 400 degree Celsius.

FIG. 3 shows a structure at a location of FIG. 1 that is the same as the location of as FIG. 1-1. Explanation of the same or similar process to the description from substrate 158 to passivation layer 174 discussed in association with FIG. 1 will be omitted. Referring back to FIG. 3, a recess with a depth D3 of about or greater than 1 um is formed in a first polymer layer 178 between two adjacent redistribution metal lines 180. An anti-electromigration layer 310 is deposited on redistribution metal line 180 to increase the resistance to electromigration. The various operations to form the partially fabricated structure of FIG. 3 is shown in more detail and described in association with FIGS. 3-1 to 3-5.

Referring to FIG. 3-1, a first polymer layer 178 is formed over passivation layer (layer 178 of FIG. 1, not shown). First polymer layer 178 is made of polymer materials such as polyimide, polybenzoxazole (PBO), silicone, benzocyclobutene (BCB), epoxy, molding compound, such as epoxy resins, molded underfill, such as resins, and the like. First polymer layer 178 may be made by any suitable method known in the art such as spin coating and an optional curing step with 200 to about 400 degree Celsius.

Referring to FIG. 3-2, redistribution metal lines 180 are deposited on first polymer layer 178 by a photolithography step, a metal deposition and optionally etching. Redistribution metal line 180 may be a single material layer, or a multi-layered structure and may be made of metals such as titanium, titanium nitride, aluminum, tantalum, copper and combinations thereof. Redistribution metal line 180 may be made by any suitable method known in the art such as physical vapor deposition (PVD), sputter, chemical vapor deposition (CVD) or electroplating. The spacing between two adjacent redistribution metal lines 180 is less than about 20 um. In some embodiment, the spacing between two adjacent redistribution metal lines 180 is less than about 10 um. A cleaning step is used to remove photoresist of the photolithography step.

Referring to FIG. 3-3, an anti-electromigration layer 310 is deposited on redistribution metal line 180. The anti-electromigration layer 310 has a thickness about 100 Angstroms to about 10000 Angstroms. The anti-electromigration layer 310 may include gold (Au), silver (Ag), palladium (Pd), indium (In), nickel (Ni), germanium (Ge), Platinum (Pt), nickel-palladium-gold, nickel-gold, other similar noble metal, and combinations thereof. In some embodiments, the anti-electromigration layer 310 is a multi-layer structure including at least one of Pt, Pd, Ge, In, Au, Ag, Ni, Pd-based alloy, Au-based alloy, Ag-based alloy, Ni-based alloy, Ge-based alloy, In-based alloy, and Pt-based alloy. Anti-electromigration layer 310 may be made by any suitable method known in the art such as physical vapor deposition (PVD), sputter, chemical vapor deposition (CVD) or electroplating.

Referring to FIG. 3-4, a recess 320 is optionally formed in first polymer layer 178 on the portions which are not covered by redistribution metal line 180. The depth D3 of recess 320 is about or greater than 1 um. The forming method of recess 320 may be a plasma etch with gas, such as nitrogen, oxygen, nitrous oxide, oxygen-based gas, oxygen-based gas mixture, helium, argon, and the like using the redistribution metal lines 180 and anti-electromigration layer 310 as an etch mask. In some embodiments, the forming method of recess 320 may be an ion bombardment with gas such as nitrogen, argon, nitrogen based gas, and the like. A cleaning step may follow to remove byproducts from the plasma etch.

Figure 3:
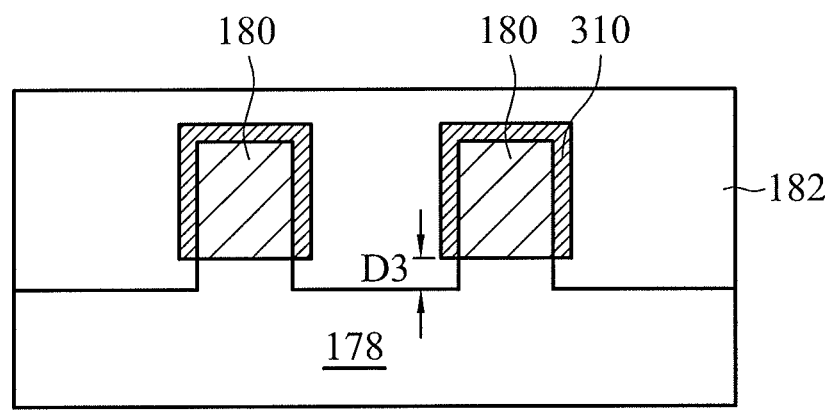
Figures 1, 3:
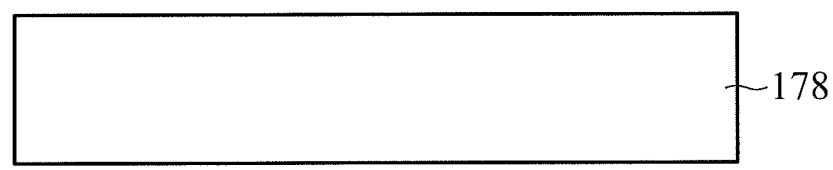
Figures 2, 3:
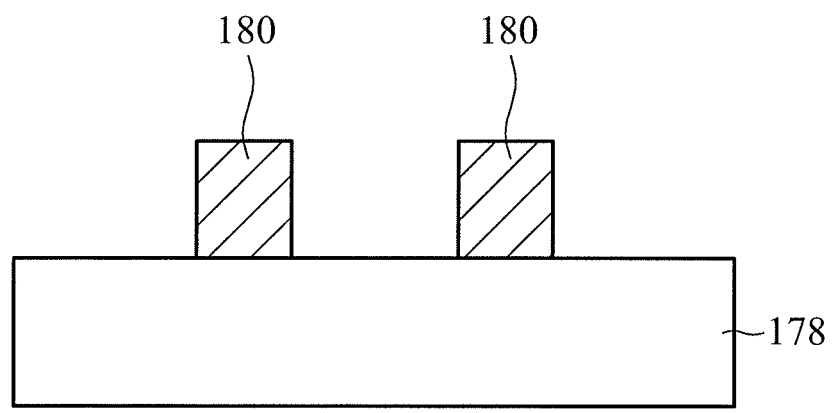
Figure 3:
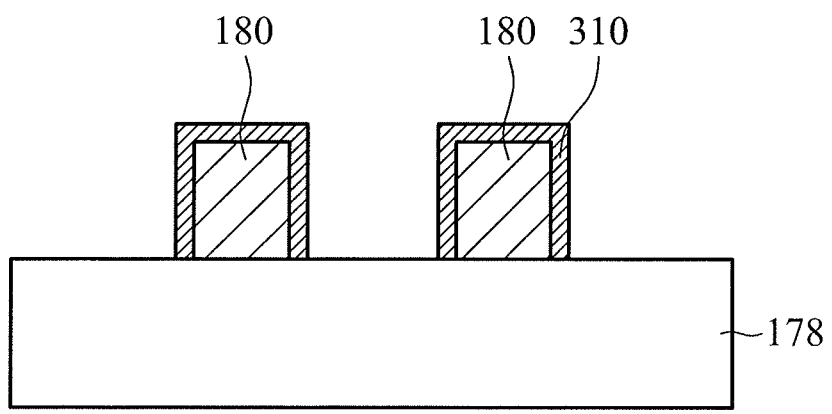
Figures 3, 4:
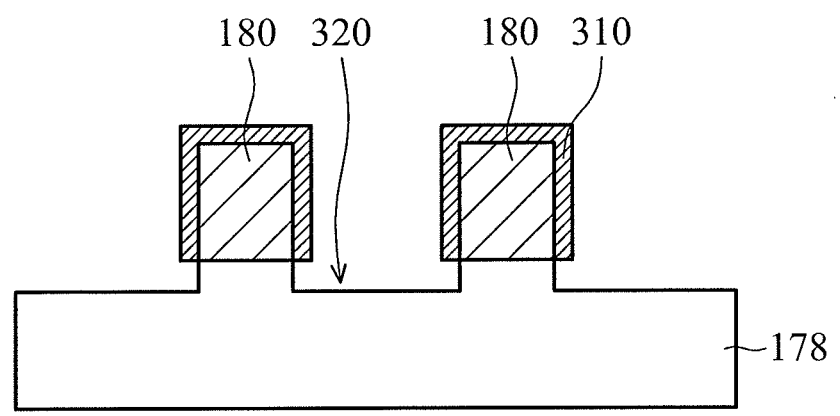
Figures 3, 4, 5:
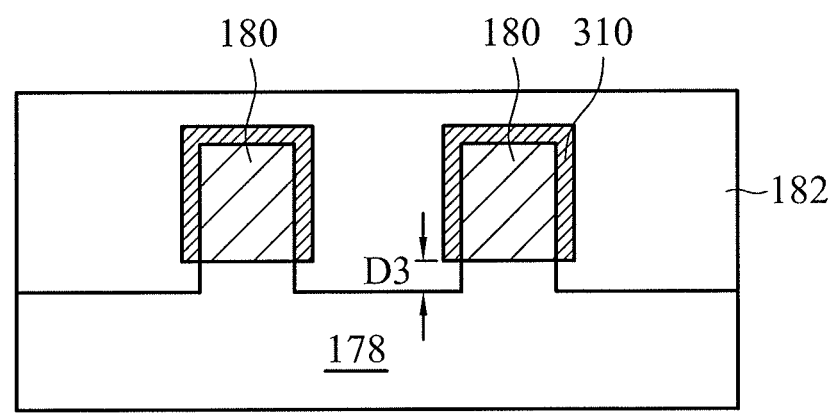
Figure 4:
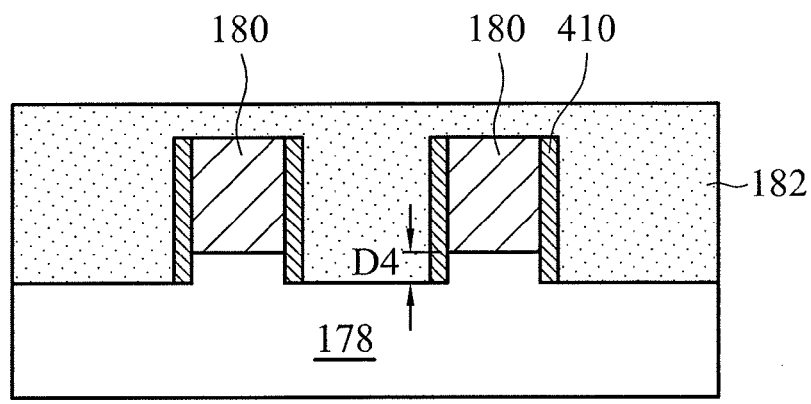
Figures 1, 4:
Figures 2, 4:
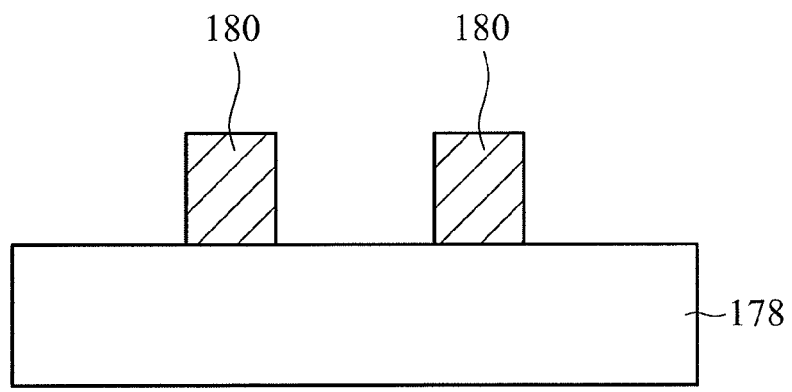
Figures 3, 4:
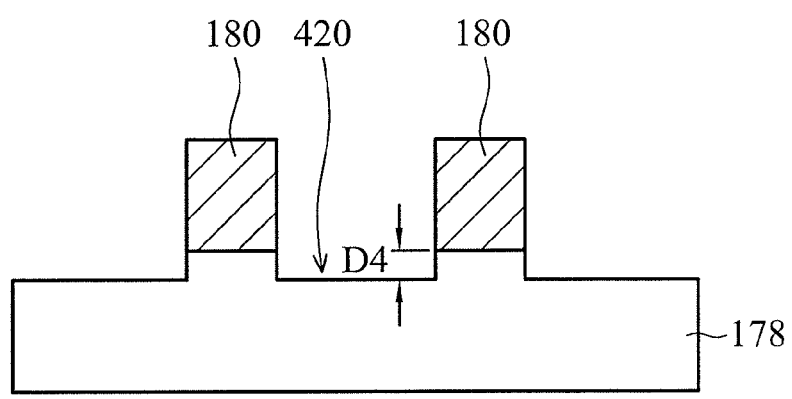
Figure 4:
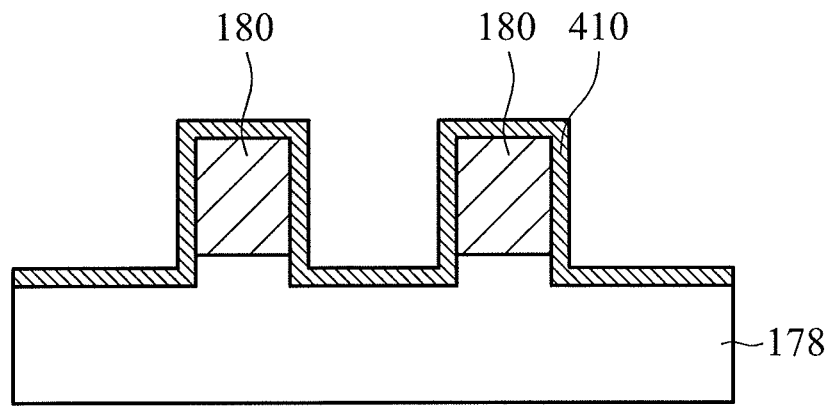
Figures 4, 5:
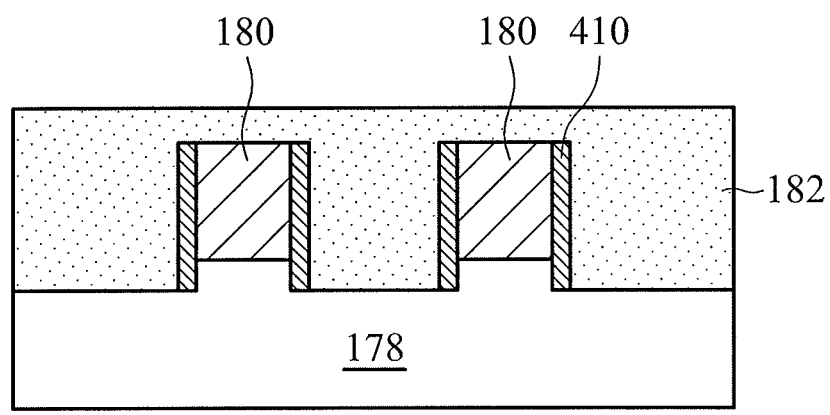
Figure 5:
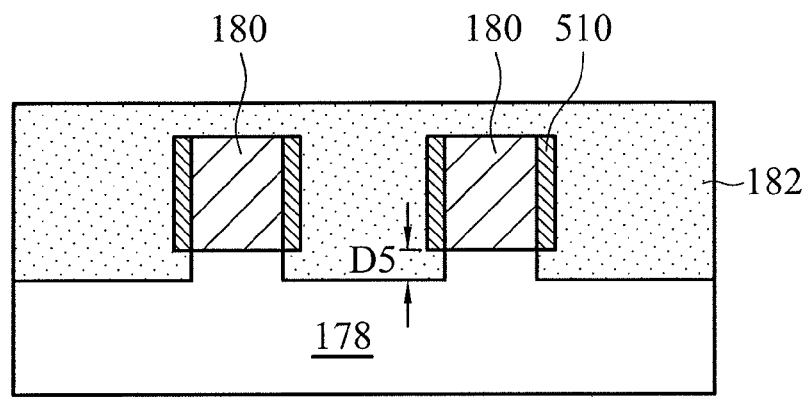
Figures 1, 5:
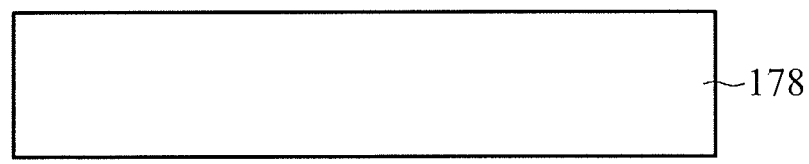
Figures 2, 5:
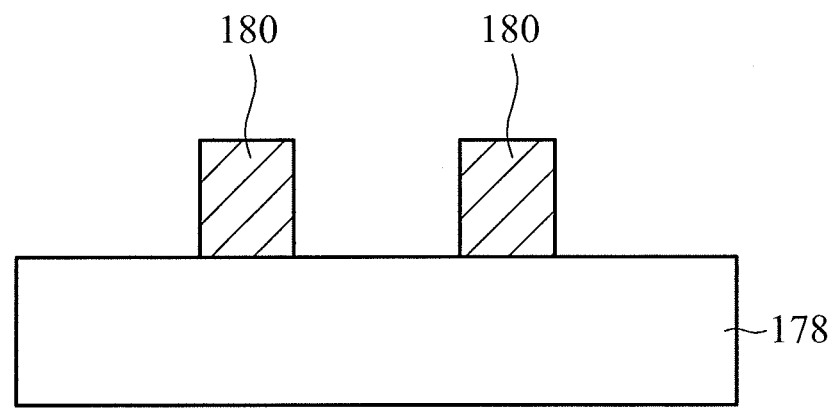
Figures 3, 5:
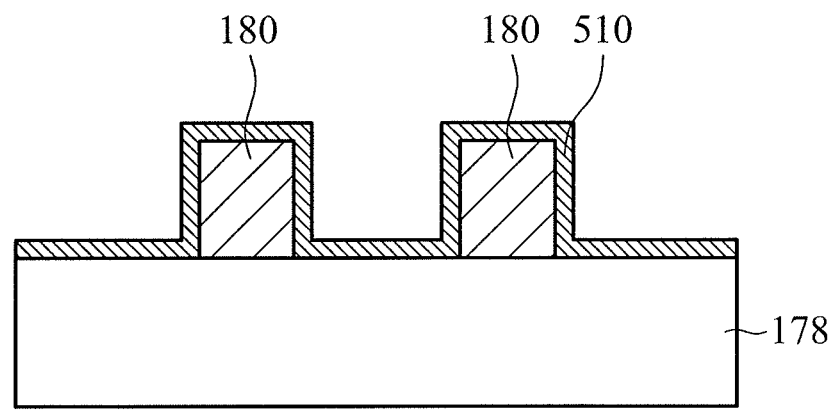
Figures 4, 5:
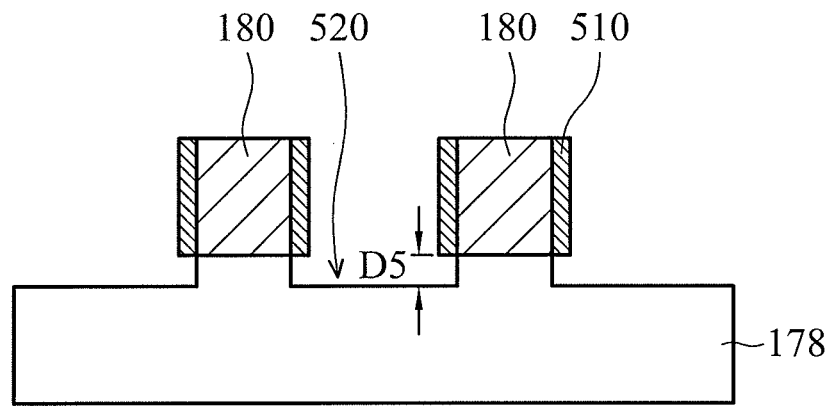
Figure 5:
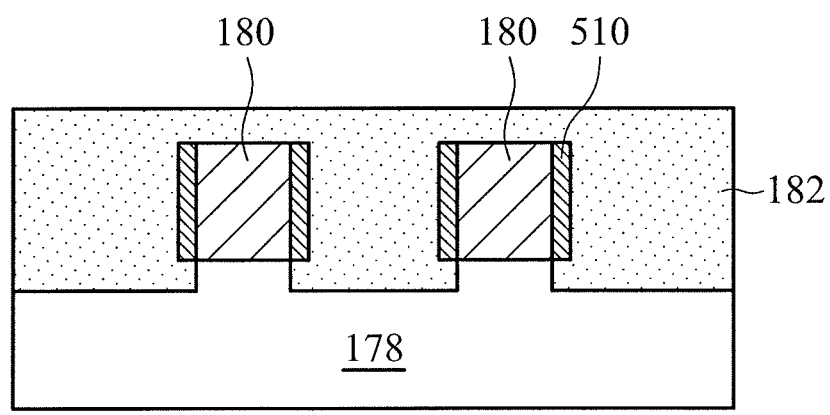

Referring to FIG. 3-5, a second polymer layer 182 is formed over and around on redistribution metal lines 180 and first polymer layer 178. Second polymer layer 182 is made of polymer materials such as polyimide, polybenzoxazole (PBO), silicone, benzocyclobutene (BCB), epoxy, molding compound, such as epoxy resins, molded underfill such as resins and the like. Second polymer layer 182 may be made by any suitable method known in the art such as spin coating or lamination and an optional curing step with 200 to about 400 degree Celsius.

FIG. 4 shows a structure at a location of FIG. 1 that is the same as the location of as FIG. 1-1. Explanation of the same or similar process to the description from substrate 158 to passivation layer 174 discussed in association with FIG. 1 will be omitted. A recess with a depth D4 of about or greater than 1 um is formed in a first polymer layer 178 between two adjacent redistribution metal lines 180. An anti-electromigration layer 410 is deposited on redistribution metal line 180 to increase the resistance to electromigration. The various operations to form the partially fabricated structure of FIG. 4 is shown in more detail and described in association with FIGS. 4-1 to 4-5.

Referring to FIG. 4-1, a first polymer layer 178 is formed over passivation layer (layer 178 of FIG. 1, not shown). First polymer layer 178 is made of polymer materials such as polyimide, polybenzoxazole (PBO), silicone, benzocyclobutene (BCB), epoxy, molding compound, such as epoxy resins, molded underfill, such as resins and the like. First polymer layer 178 may be made by any suitable method known in the art such as spin coating and an optional curing step with 200 to about 400 degrees Celsius.

Referring to FIG. 4-2, redistribution metal lines 180 are deposited on first polymer layer 178 by a photolithography step, a metal deposition and optionally etching. Redistribution metal line 180 may be a single material layer, or a multi-layered structure and may be made of metals such as titanium, titanium nitride, aluminum, tantalum, copper and combinations thereof. Redistribution metal line 180 may be made by any suitable method known in the art such as physical vapor deposition (PVD), sputter, chemical vapor deposition (CVD) or electroplating. A spacing between two adjacent redistribution metal lines 180 is less than about 20 um. In some embodiments, a spacing between two adjacent redistribution metal lines 180 is less than about 10 um. A cleaning step is used to remove photo resist of the photolithography step.

Referring to FIG. 4-3, a recess 420 is formed in first polymer layer 178 on the portions which are not covered by redistribution metal line 180. The depth D4 of recess 420 is about or greater than 1 um. The forming method of recess 420 may be a plasma etch with gas such as nitrogen, oxygen, nitrous oxide, oxygen-based gas, oxygen-based gas mixture, helium, argon, and the like using the metal lines 180 as an etch mask. In some embodiments, the forming method of recess 420 may be an ion bombardment with gas such as nitrogen, argon, nitrogen based gas, and the like. A cleaning step may follow to remove by products from the plasma etch.

Referring to FIG. 4-4, an anti-electromigration layer 410 is deposited on redistribution metal line 180 and the anti-electromigration layer 410 has a thickness about 100 Angstroms to about 10000 Angstroms. The anti-electromigration layer 410 is a non-metal material layer, for example a dielectric material layer, a polymer material layer or combination thereof. The anti-electromigration layer 410 may be a single layer, or a multi-layered structure. In some embodiments, the anti-electromigration layer 410 is a dielectric material layer formed of silicon nitride, silicon oxide, silicon oxynitride, silicon carbide, silicon carbon nitride, alternating layers of silicon oxide and silicon nitride, or combinations thereof by using any of a variety of deposition techniques, including thermal oxidation, LPCVD (low-pressure chemical vapor deposition), APCVD (atmospheric-pressure chemical vapor deposition), PECVD (plasma-enhanced chemical vapor deposition), HWCVD (hot wire chemical vapor deposition) and future-developed deposition procedures. In some embodiments, the anti-electromigration layer 410 is a polymer material layer, such as an epoxy, polyimide, benzocyclobutene (BCB), polybenzoxazole (PBO), and the like, although other relatively soft, often organic, dielectric materials can also be used.

An etch process optionally follows after the anti-electromigration layer 410 to remove a portion of the anti-electromigration layer 410 on redistribution metal line 180 and first polymer layer 178. The etch process includes a dry etch such as a plasma etch or reactive ion etch.

Referring to FIG. 4-5, a second polymer layer 182 is formed over and around redistribution metal lines 180 and first polymer layer 178. Second polymer layer 182 is made of polymer materials such as polyimide, polybenzoxazole (PBO), silicone, benzocyclobutene (BCB), epoxy, molding compound, such as epoxy resins, molded underfill, such as resins and the like. Second polymer layer 182 may be made by any suitable method known in the art such as spin coating or lamination and an optional curing step with 200 to about 400 degrees Celsius.

FIG. 5 shows a structure at a location of FIG. 1 that is the same as the location of as FIG. 1. Explanation of the same or similar process to the description from substrate 158 to passivation layer 174 discussed in association with FIG. 1 will be omitted. Referring back to FIG. 5, a recess with a depth D5 of about or greater than 1 um is formed in a first polymer layer 178 between two adjacent redistribution metal lines 180. An anti-electromigration layer 510 is formed on redistribution metal line 180 to increase the resistance to electromigration. The various operations to form the partially fabricated structure of FIG. 5 is shown in more detail and described in association with FIGS. 5-1 to 5-5.

Referring to FIG. 5-1, a first polymer layer 178 is formed over passivation layer (layer 178 of FIG. 1, not shown). First polymer layer 178 is made of polymer materials such as polyimide, polybenzoxazole (PBO), silicone, benzocyclobutene (BCB), epoxy, molding compound, such as epoxy resins, molded underfill, such as a resin and the like. First polymer layer 178 may be made by any suitable method known in the art such as spin coating and an optional curing step with 200 to about 400 degrees Celsius.

Referring to FIG. 5-2, redistribution metal lines 180 are deposited on first polymer layer 178 by a photolithography step, a metal deposition and optionally etching. Redistribution metal line 180 may be a single material layer or a multi-layered structure and may be made of metals such as titanium, titanium nitride, aluminum, tantalum, copper and combinations thereof. Redistribution metal line 180 may be made by any suitable method known in the art such as physical vapor deposition (PVD), sputter, chemical vapor deposition (CVD) or electroplating. The spacing between two adjacent redistribution metal lines 180 is less than about 20 um. In some embodiment, the spacing between two adjacent redistribution metal lines 180 is less than about 10 um. A cleaning step is used to remove photoresist of the photolithography step.

Referring to FIG. 5-3, an anti-electromigration layer 510 is deposited on redistribution metal line 180 and the anti-electromigration layer 510 has a thickness about 100 Angstroms to about 10000 Angstroms. The anti-electromigration layer 510 is a non-metal material layer, for example a dielectric material layer, a polymer material layer or combination thereof. The anti-electromigration layer 510 may be a single layer, or a multi-layered structure. In some embodiments, the anti-electromigration layer 510 is a dielectric material layer formed of silicon nitride, silicon oxide, silicon oxynitride, silicon carbide, silicon carbon nitride, alternating layers of silicon oxide and silicon nitride, or combinations thereof by using any of a variety of deposition techniques, including thermal oxidation, LPCVD (low-pressure chemical vapor deposition), APCVD (atmospheric-pressure chemical vapor deposition), PECVD (plasma-enhanced chemical vapor deposition), HWCVD (hot wire chemical vapor deposition) and future-developed deposition procedures. In some embodiments, the anti-electromigration layer 510 is a polymer material layer, such as an epoxy, polyimide, benzocyclobutene (BCB), polybenzoxazole (PBO), and the like, although other relatively soft, often organic, dielectric materials can also be used.

Referring to FIG. 5-4, a recess 520 is formed in first polymer layer 178 on the portions which are not covered by redistribution metal line 180. The depth D5 of recess 520 is about or greater than 1 um. The forming method of recess 520 may be a plasma etch with gas such as nitrogen, oxygen, nitrous oxide, oxygen-based gas, oxygen-based gas mixture, helium, argon, and the like using the metal lines 180 and anti-electromigration layer 510 as an etch mask. In some embodiments, the forming method of recess 520 may be an ion bombardment with gas such as nitrogen, argon, nitrogen based gas, and the like. A cleaning step may follow to remove the byproducts from the plasma etch.

Referring to FIG. 5-5, a second polymer layer 182 is formed over and around on redistribution metal lines 180 and first polymer layer 178. Second polymer layer 182 is made of polymer materials such as polyimide, polybenzoxazole (PBO), silicone, benzocyclobutene (BCB), epoxy, molding compound, such as epoxy resins, molded underfill such as a resin and the like. Second polymer layer 182 may be made by any suitable method known in the art such as spin coating or lamination and an optional curing step with 200 to about 400 degrees Celsius.

Figure 6:
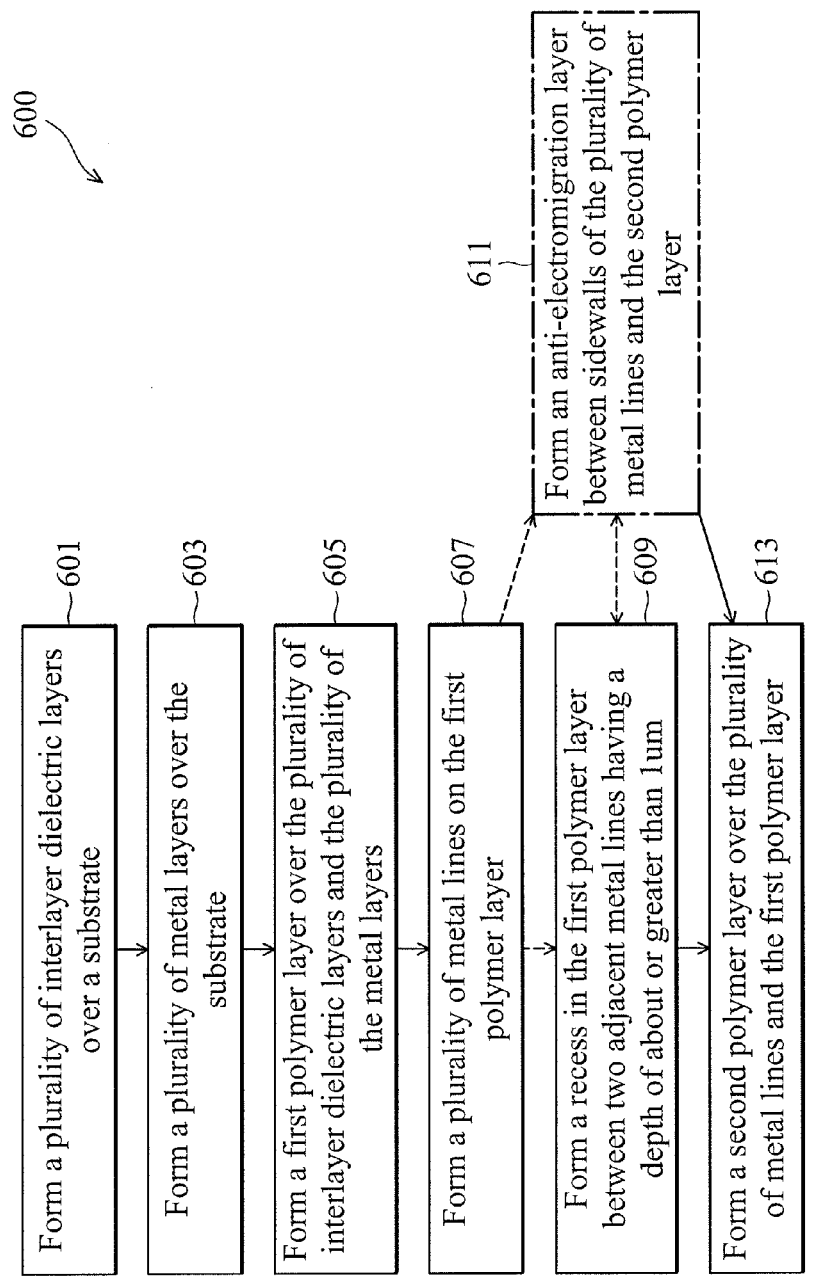
FIG. 6 is a flow chart for a method of forming a recess and anti-electromigration layer in a semiconductor die in accordance with various embodiments of the present disclosure.

FIG. 6 is a flowchart of a method 600 described above in association with FIG. 2 to FIG. 5-5. The method begins at operation 601 by forming a plurality of dielectrics layers over a substrate. The substrate may include a number of devices formed in and over the substrate. At operation 603 a plurality of metal layers is formed over the substrate in the plurality of dielectric layer. One skilled in the art will recognize that operations 601 and 603 may be repeated iteratively to from multiple metal layers within multiple respective dielectric layers. At operation 605, a first polymer layer is formed over the plurality of dielectric layers and the plurality of the metal layers, corresponding to FIGS. 2-1, 3-1, 4-1, and 5-1. At operation 607, a plurality of metal lines is formed on the first polymer layer, corresponding to FIGS. 2-2, 3-2, 4-2, and 5-2. At operation 609, a recess in the first polymer layer is formed between two adjacent metal lines and the depth of the recess is about or greater than 1 um. This operation 609 corresponds to FIGS. 2-3, 3-4, 4-3, and 5-4. At optional operation 611, an anti-electromigration layer is formed between sidewalls of the plurality of metal lines and the second polymer layer. The optional operation 611 corresponds to FIGS. 3-3, 4-4, and 5-3. In some embodiments, operation 611 follow after operation 609, corresponding to FIGS. 4, 4-1 to 4-5 and associated text. In some embodiments, operation 611 follows operation 607, corresponding to FIGS. 5, 5-1 to 5-5 and associated text. In some embodiments, operation 609 follows operation 611, corresponding to FIGS. 3, 3-1 to 3-5 and associated text. At operation 613, a second polymer layer is formed over the plurality of metal lines and the first polymer layer.

In some embodiments, the present disclosure pertains to a semiconductor device. The device includes a substrate, a number of interlayer dielectric layers over the substrate, a number of metal layers over the substrate, a first polymer layer over the plurality of interlayer dielectric layers and the metal layers, a number of metal lines on the first surface of the polymer layer, and a second polymer layer on the metal lines and the first polymer layer. The first polymer layer has a first surface, a second surface on the same side as the first surface and a third surface opposing the first surface, and a depth difference of the first surface and the second surface is about or greater than 1 um.

The present disclosure also pertains to a semiconductor device including a substrate, a number of interlayer dielectric layers over the substrate, a number of metal layers over the substrate, a first polymer layer over the interlayer dielectric layers and the metal layers, a number of metal lines on the first surface of the first polymer layer, a second polymer layer on the metal lines, and an anti-electromigration layer between sidewalls of the metal lines and the second polymer layer.

In some embodiments, a plurality of interlayer dielectric layers is formed over a substrate and a plurality of metal layers is formed over a substrate. A first polymer layer is formed over the plurality of interlayer dielectric layers and the plurality of the metal layers. A first polymer layer has a first surface, a second surface on the same side as the first surface and a third surface opposing the first surface, and a depth difference of the first surface and the second surface is about or greater than 1 um. A plurality of metal lines is formed over the first surface of the polymer layer and a second polymer layer is formed over the plurality of metal lines and the first polymer layer.

In some embodiments, a plurality of interlayer dielectric layers is formed over a substrate and a plurality of metal layers is formed over a substrate. A first polymer layer is formed over the plurality of interlayer dielectric layers and the plurality of the metal layers. A plurality of metal lines is formed over the first surface of the polymer layer and a second polymer layer is formed over the plurality of metal lines and the first polymer layer. An anti-electromigration layer is deposited between sidewalls of the plurality of metal lines and the second polymer layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a substrate;
    a plurality of interlayer dielectric layers over the substrate;
    a plurality of metal layers over the substrate;
    a first polymer layer over the plurality of interlayer dielectric layers and the plurality of metal layers;
    wherein the first polymer layer has a first surface, a second surface on the same side as the first surface and a third surface opposing the first surface, and a depth difference of the first surface and the second surface is about or greater than 1 um;
    a plurality of metal lines on the first surface of the first polymer layer; and
    a second polymer layer on the plurality of metal lines and the first polymer layer.

2. The device of claim 1 further comprising a non-metal material layer between sidewalls of the plurality of metal lines and the second polymer layer.

3. The device of claim 2, wherein the non-metal material layer comprises silicon nitride, silicon oxide, silicon oxynitride, silicon carbide, silicon carbon nitride, or a combination thereof.

4. The device of claim 1, wherein the first polymer layer comprises polyimide, polybenzoxazole, silicone, benzocyclobutene, epoxy, resins or a combination thereof.

5. The device of claim 1, wherein the second polymer layer comprises polyimide, polybenzoxazole, silicone, benzocyclobutene, epoxy, resins or a combination thereof.

6. The device of claim 1, wherein the plurality of metal lines is made of copper, tantalum, aluminum, titanium, gold or a combination thereof.

7. The device of claim 6, wherein the copper is formed by electroplating or plating.

8. The device of claim 1, wherein the spacing between two adjacent metal lines of the plurality of metal lines is less than about 20 um.

9. The device of claim 1, wherein the interlayer dielectric layers comprise low-k dielectric materials and the dielectric constant of low-k dielectric materials is lower than about 3.

10. A device comprising:
a substrate;
a plurality of interlayer dielectric layers over the substrate;
a plurality of metal layers over the substrate;
a first polymer layer over the plurality of interlayer dielectric layers and the plurality of metal layers;
a plurality of metal lines on the first surface of the first polymer layer;
a second polymer layer on the plurality of metal lines; and,
an anti-electromigration layer between sidewalls of the plurality of metal lines and the second polymer layer.

11. The device of claim 10, wherein the wherein the plurality of metal lines is made of copper, tantalum, aluminum, titanium, gold, or a combination thereof.

12. The device of claim 11, wherein the copper is formed by electroplating or plating.

13. The device of claim 10, wherein the first polymer layer has a first surface, a second surface on the same side as the first surface and a third surface opposing the first surface, and a depth difference of the first surface and the second surface is about or greater than 1 um.

14. The device of claim 10, wherein the anti-electromigration layer is gold, nickel, platinum, tin, titanium, palladium, titanium nitride, tungsten, silver, germanium, indium, or a combination thereof.

15. The device of claim 10, wherein the first layer comprises polyimide, polybenzoxazole, silicone, benzocyclobutene, epoxy, resins or the combination thereof.

16. The device of claim 10, wherein the second polymer layer comprises polyimide, polybenzoxazole, silicone, benzocyclobutene, epoxy, resins or the combination thereof.

17. The device of claim 10, wherein the spacing between two adjacent metal lines of the plurality of metal lines is less than about 20 um.

18. A method of forming a device comprising:
providing a substrate;
forming a plurality of interlayer dielectric layers over the substrate;
forming a plurality of metal layers over the substrate;
forming a first polymer layer over the plurality of dielectric layers and the plurality of metal layers;
forming a plurality of metal lines on the first polymer layer;
forming a recess in the first polymer layer between two adjacent metal lines, the recess having a depth of about or greater than 1 um; and
forming a second polymer layer on the plurality of metal lines.

19. The method of claim 18, wherein the first polymer layer comprises polyimide, polybenzoxazole, silicone, benzocyclobutene, epoxy, resins or a combination thereof.

20. The method of claim 18, wherein the second polymer layer comprises polyimide, polybenzoxazole, silicone, benzocyclobutene, epoxy, resins or a combination thereof.

21. The method of claim 18 further comprising:
forming an anti-electromigration layer between sidewalls of the plurality of metal lines and the second polymer layer.

* * * * *